United States Patent
Hong

(10) Patent No.: US 11,205,570 B2
(45) Date of Patent: Dec. 21, 2021

(54) METHOD FOR MANUFACTURING SINGLE-GRAINED NANOWIRE AND METHOD FOR MANUFACTURING SEMICONDUCTOR DEVICE EMPLOYING SAME SINGLE-GRAINED NANOWIRE

(71) Applicant: Ying Hong, Liaoning (CN)

(72) Inventor: Ying Hong, Liaoning (CN)

(*) Notice: Subject to any disclaimer, the term of this patent is extended or adjusted under 35 U.S.C. 154(b) by 0 days.

(21) Appl. No.: 17/028,332

(22) Filed: Sep. 22, 2020

(65) Prior Publication Data
US 2021/0005452 A1    Jan. 7, 2021

Related U.S. Application Data

(63) Continuation of application No. PCT/KR2019/002504, filed on Mar. 5, 2019.

(30) Foreign Application Priority Data

Mar. 23, 2018 (KR) .................. 10-2018-0034098
Dec. 26, 2018 (KR) .................. 10-2018-0169900

(51) Int. Cl.
*H01L 29/04* (2006.01)
*H01L 29/10* (2006.01)
(Continued)

(52) U.S. Cl.
CPC .. *H01L 21/02672* (2013.01); *H01L 21/02502* (2013.01); *H01L 27/1222* (2013.01);
(Continued)

(58) Field of Classification Search
CPC ......... H01L 21/02603; H01L 21/02598; H01L 27/1277; H01L 21/02672; H01L 29/66757; H01L 29/78696
See application file for complete search history.

(56) References Cited

U.S. PATENT DOCUMENTS

2002/0028541 A1* 3/2002 Lee ............ G11C 16/3427
                                                    438/149
2002/0053672 A1* 5/2002 Yamazaki ....... H01L 27/1108
                                                    257/66
(Continued)

FOREIGN PATENT DOCUMENTS

JP      2010-141224     6/2010
JP      5445207         3/2014
(Continued)

OTHER PUBLICATIONS

Reduction of Leakage Current in Metal-Induced Lateral Crystallization Polysilicon TFTs (Year: 2005).*
(Continued)

*Primary Examiner* — Brian Turner
(74) *Attorney, Agent, or Firm* — Burris Law, PLLC

(57) ABSTRACT

A method of manufacturing a semiconductor nanowire semiconductor device is described. The method includes forming an amorphous channel material layer on a substrate, patterning the channel material layer to form semiconductor nanowires extending in a lateral direction on the substrate, and forming a cover layer covering an upper of the semiconductor nanowire. The cover layer and the nanowire are patterned to form a trench exposing a side surface of an one end of the semiconductor nanowire and a catalyst material layer is formed in contact with a side surface of the semiconductor nanowire, and metal induced crystallization (MIC) by heat treatment is performed to crystallize the semiconductor nanowire in a length direction of the nanowire from the one end of the semiconductor nanowire in contact with the catalyst material.

7 Claims, 28 Drawing Sheets

(51) Int. Cl.
*H01L 31/036* (2006.01)
*H01L 31/20* (2006.01)
*H01L 29/76* (2006.01)
*H01L 29/15* (2006.01)
*H01L 21/02* (2006.01)
*H01L 27/12* (2006.01)
*H01L 29/06* (2006.01)
*H01L 29/423* (2006.01)
*H01L 29/66* (2006.01)
*H01L 29/786* (2006.01)

(52) U.S. Cl.
CPC ........ *H01L 27/1277* (2013.01); *H01L 29/045* (2013.01); *H01L 29/0673* (2013.01); *H01L 29/42392* (2013.01); *H01L 29/66757* (2013.01); *H01L 29/66772* (2013.01); *H01L 29/78642* (2013.01); *H01L 21/02488* (2013.01); *H01L 21/02491* (2013.01); *H01L 21/02532* (2013.01); *H01L 21/02595* (2013.01); *H01L 29/0676* (2013.01)

(56) References Cited

U.S. PATENT DOCUMENTS

| | | | | |
|---|---|---|---|---|
| 2002/0074548 | A1* | 6/2002 | Lee | ............. H01L 29/78645 257/59 |
| 2003/0148567 | A1* | 8/2003 | Joo | ............. H01L 29/6675 438/200 |
| 2004/0046171 | A1 | 3/2004 | Lee et al. | |
| 2017/0141119 | A1* | 5/2017 | Hu | ............. H01L 27/11582 |

FOREIGN PATENT DOCUMENTS

| | | |
|---|---|---|
| KR | 1020020033373 | 5/2002 |
| KR | 10-2003-0060403 | 7/2003 |
| KR | 10-0611761 | 8/2006 |
| KR | 10-0635068 | 10/2006 |
| KR | 10-2008-0041737 | 5/2008 |
| KR | 10-0984618 | 9/2010 |
| KR | 10-2010-0132167 | 12/2010 |

OTHER PUBLICATIONS

Office Action issued in corresponding KR Application No. 1020180169900, dated Mar. 30, 2021.
International Search Report for International Application PXT/KR2019/002504, dated Jun. 11, 2019.

* cited by examiner

METHOD FOR MANUFACTURING SINGLE-GRAINED NANOWIRE AND METHOD FOR MANUFACTURING SEMICONDUCTOR DEVICE EMPLOYING SAME SINGLE-GRAINED NANOWIRE

CROSS-REFERENCE TO RELATED APPLICATIONS AND PRIORITY

The present application is a continuation of International Application No. PCT/KR2019/002504, filed on Mar. 5, 2019, which claims priority to and the benefit of the filing dates of Korean Patent Application Nos. 10-2018-0034098, filed on Mar. 23, 2018, and 10-2018-016900, filed on Dec. 26, 2018, in the Korean Intellectual Property Office, the disclosures of which are incorporated herein in their entirety by reference.

TECHNICAL FIELD

The present disclosure relates to a method of manufacturing a single crystal-grained nanowire and a method of manufacturing a semiconductor device using the same.

BACKGROUND

High-performance semiconductor devices improve the quality of electronic products and come with benefits in terms of cost. Such a semiconductor device needs to have a semiconductor channel of high mobility and reliability, and in particular, as semiconductor channels have certain characteristics, it is necessary to reduce the characteristic spread.

AM-OLED (active-matrix organic light-emitting diode) displays are mainly applied to mobile devices of recent smartphones. As a pixel switching element of this AM-OLED display, a low temperature polycrystalline silicon thin film transistor (LTPS TFT) having high mobility and high reliability even under a high degree of integration is suitable.

Excimer Laser Annealing (ELA) is mainly applied to the manufacture of low-temperature polycrystalline silicon thin film transistors (LTPS TFT) for crystallization of silicon. The disadvantage of the LTPS TFT is that it is difficult to maintain a certain level of crystal grain uniformity when applied to a large-area display, and the yield is low.

SUMMARY

Exemplary embodiments propose a method of manufacturing high quality single crystal-grained nanowires oriented to <111> direction using MIC technology.

Exemplary embodiments propose a method of manufacturing a single crystal-grained nanowire in which crystal grains are grown in a lateral direction with respect to a substrate, and a method of a semiconductor device applying the same.

According to an exemplary embodiment, a method of manufacturing a single crystal-grained nanowire includes steps of (i) forming an amorphous channel material layer to be crystallized on a substrate; (ii) patterning the channel material layer to form semiconductor nanowires extending in a lateral direction on the substrate; (iii) forming a cover layer covering an upper surface of the semiconductor nanowire; (iv) patterning the cover layer and the nanowire to form a trench exposing a side section of one end of the semiconductor nanowire; (v) forming a catalyst material layer in contact with the side section of the one end of the semiconductor nanowire; and (vi) performing metal induced crystallization (MIC) by heat treatment to crystallize the semiconductor nanowire in a length direction of the nanowire from the one end of the semiconductor nanowire in contact with the catalyst material.

According to another exemplary embodiment, a method of manufacturing a nanowire semiconductor element includes step of (i) forming a multi-layered film including an amorphous channel material layer, an amorphous conductive semiconductor layer, and a metal layer on a substrate; (ii) patterning the multi-layered film to form at least one multi-layered block including a nanowire channel material layer, a strip-type conductive semiconductor layer, and a metal layer in a portion defined as a transistor region; (iii) forming a cover layer covering the multi-layered block; (iv) forming a trench having an inner wall on the cover layer, wherein the trench exposes an one end of the channel material layer; (v) patterning the cover layer and the channel material layer to expose the one end of the channel material layer; (vi) forming a catalyst material layer on the cover layer and inside the trench to contact the catalyst material layer with the one end of the channel material layer exposed to the inner wall of the trench; (vii) heat-treating the multi-layered film to crystallize the channel material layer; and (viii) patterning the metal layer and the conductive semiconductor layer after removing the cover layer covering the metal layer to form a source and a drain, and a source electrode and a drain electrode corresponding to the semiconductor material layer.

According to an exemplary embodiment, the amorphous channel material layer may be formed of any one selected from the group consisting of Si, SiGe, and Ge.

According to an exemplary embodiment, the catalyst material layer may be formed of at least one material selected from the group consisting of Ni, NiOx, NiCxOy, NiNxOy, NiCxNyOz, NiCxOy:H, NiNxOy:H, NiCxNyOz:H, NixSiy, and NixGey.

According to an exemplary embodiment, the amorphous channel material layer may be formed of an intrinsic semiconductor or a non-intrinsic semiconductor material containing a p-type impurity or an n-type impurity.

According to an exemplary embodiment, the forming of the multi-layered block include steps of forming a first multi-layered block including a p-type nanowire channel material layer, an n-type conductive semiconductor layer, and a metal layer; and forming a second multi-layered block including an n-type nanowire channel material layer, a p-type conductive semiconductor layer, and a metal layer.

An exemplary embodiment proposes a method of manufacturing a lateral semiconductor nanowire channel in which crystals are grown in the <111> direction, and a method of manufacturing a semiconductor such as CMOS by applying the same. This exemplary embodiment can realize a system on panel (SOP) by fabricating a high-performance LSI, memory, sensor, etc. on a large-area substrate. According to this exemplary embodiment, ion implantation and a separate activation process for forming a conductive layer such as a source/drain are not required. Therefore, according to an exemplary embodiment, it is possible to obtain a high-yield semiconductor device with high mobility, high reliability, and small product-to-product characteristic distribution.

DETAILED DESCRIPTION

Figure 1:
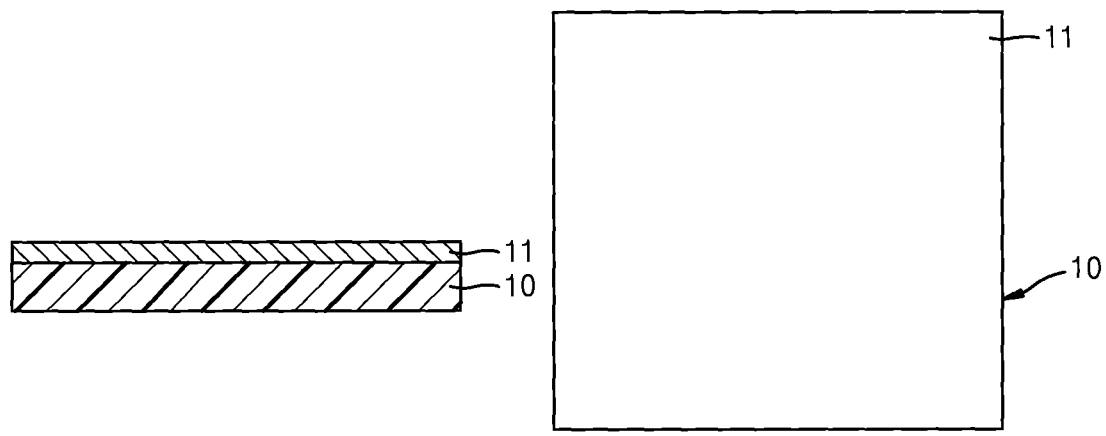
FIG. 1 illustrates an operation for forming a buffer layer on a substrate, wherein left drawing of each drawing is a cross-sectional view, and right drawing of each drawing is a plan view in FIGS. 1-7.

Hereinafter, preferred embodiments of the concept of the present invention will be described in detail with reference to the accompanying drawings. However, the embodiments of the concept of the present invention may be modified in various forms, and the scope of the concept of the present invention should not be construed as being limited by the embodiments described below. Embodiments of the inventive concept are preferably interpreted as being provided in order to more fully explain the inventive concept to those of ordinary skill in the art. Identical symbols mean the same elements all the time. Furthermore, various elements and areas in the drawings are schematically drawn. Accordingly, the inventive concept is not limited by the relative size or spacing drawn in the accompanying drawings.

Terms such as first and second may be used to describe various components, but the components are not limited by the terms. The terms are used only for the purpose of distinguishing one component from other components. For example, without departing from the scope of the present invention concept, a first component may be referred to as a second component, and conversely, a second component may be referred to as a first component.

Terms used in the present application are only used to describe specific embodiments, and are not intended to limit the concept of the present invention. The terms of a singular form may include plural forms unless otherwise specified. In the present application, expressions such as "include" or "have" are intended to designate the existence of features, numbers, steps, actions, components, parts, or combinations thereof described in the specification, and it is to be understood that the possibility of the presence or addition of one or more other features or numbers, operations, components, parts, or combinations thereof is not preliminarily excluded.

Unless otherwise defined, all terms used herein, including technical terms and scientific terms, have the same meaning as commonly understood by one of ordinary skill in the art to which the inventive concept belongs. In addition, terms commonly used, as defined in the dictionary, should be interpreted as having a meaning consistent with what they mean in the context of the technology to which they are related, and it will be understood that it should not be construed in an excessively formal sense unless explicitly defined herein.

When an embodiment can be implemented differently, a specific process order may be performed differently from the described order. For example, two processes described in succession may be performed substantially simultaneously, or may be performed in an order opposite to that described.

In the accompanying drawings, for example, depending on manufacturing techniques and/or tolerances, variations of the illustrated shape can be expected. Therefore, the embodiments of the present invention should not be construed as being limited to the specific shape of the region shown in this specification, and for example, changes in shape resulting from the manufacturing process should be included. All terms "and/or" as used herein include each and every combination of one or more of the mentioned components. In addition, the term "substrate" as used herein may refer to a substrate itself, or a laminate structure including a substrate and a predetermined layer or film formed on the surface thereof. In addition, in the present specification, "the surface of the substrate" may mean an exposed surface of the substrate itself, or an outer surface of a predetermined layer or film formed on the substrate. Moreover, what is described as "upper" or "on" may include not only directly over in contact but also over not in contact.

Hereinafter, referring to the accompanying drawings, a manufacturing process diagram shows a basic concept of manufacturing a lateral semiconductor nano-wire according to an exemplary embodiment.

In FIGS. 1 to 7 described below, left drawing of each drawing is a cross-sectional view, and right drawing of each drawing is a plan view.

As shown in FIG. 1, a buffer layer 11 is formed on a substrate 10. The buffer layer 11 may be formed of a material such as $SiO_2$ or SiNx, SiONx, AlOx, and the like.

The buffer layer 10 may be provided by a top-most dielectric layer of a multi-layered structure already formed through a preceding process.

Figure 2:
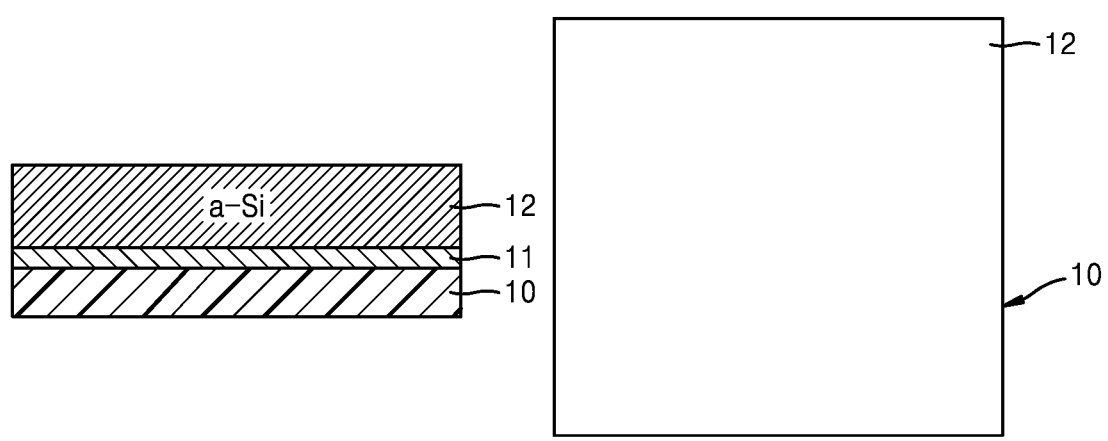
FIG. 2 illustrates an operation for forming an amorphous material layer on the buffer layer, according to an exemplary embodiment, wherein left drawing of each drawing is a cross-sectional view, and right drawing of each drawing is a plan view.

As shown in FIG. 2, an amorphous material layer 12 to be crystallized is formed on the buffer layer 11. The amorphous material layer may be formed of an intrinsic semiconductor or a non-intrinsic semiconductor material doped with a p-type impurity or an n-type impurity. The semiconductor material layer may be formed of any one selected from the group consisting of Si, SiGe, and Ge, and in the present embodiment, the amorphous material layer 12 is formed of amorphous silicon (a-Si). According to another embodiment, the amorphous material layer 12 may have a multi-layered structure in which a p-type semiconductor material layer and an n-type semiconductor material layer are sequentially stacked.

Figure 3:
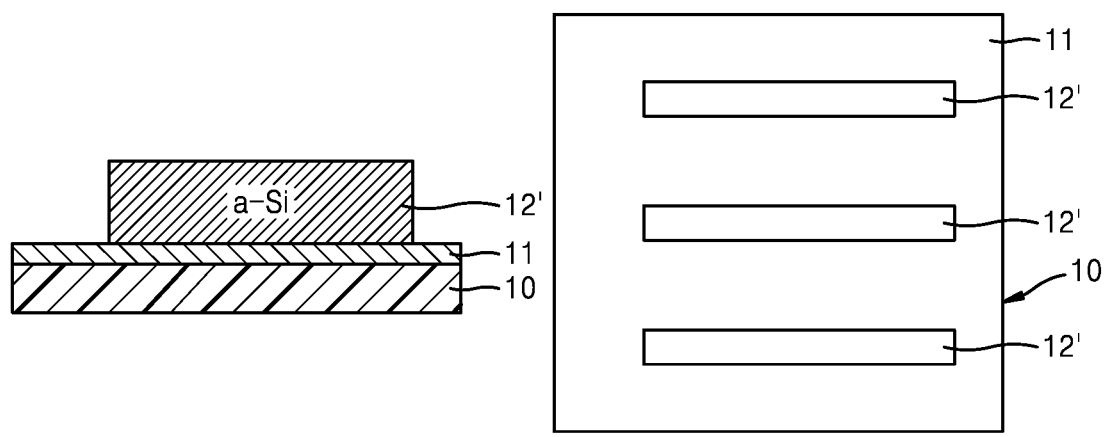
FIG. 3 illustrates an operation for pattering the amorphous material layer on the buffer layer, according to an exemplary embodiment, wherein left drawing of each drawing is a cross-sectional view, and right drawing of each drawing is a plan view.

As shown in FIG. 3, the amorphous material layer 12 is patterned to form a plurality of nanowires 12' to be used as channels of a semiconductor device in parallel. Here, the nanowire 12' may be used as a channel of a plurality of transistors, diodes, and sensors, and according to another embodiment, only one nanowire 12' may be formed for one semiconductor device.

Figure 4:
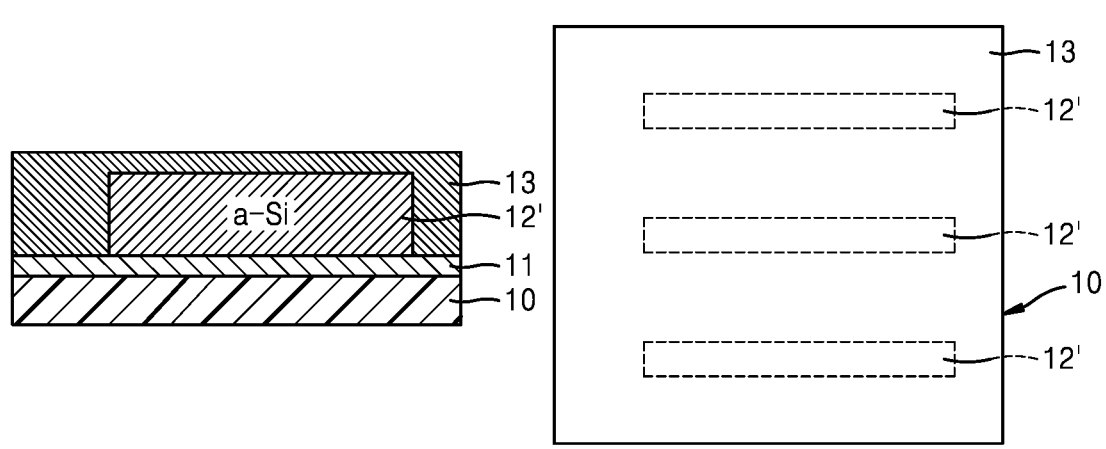
FIG. 4 illustrates an operation for forming a cover layer over the amorphous material layer and the substrate, according to an exemplary embodiment, wherein left drawing of each drawing is a cross-sectional view, and right drawing of each drawing is a plan view.

As shown in FIG. 4, a cover layer 13 is formed on the nanowire 12' using an insulating material such as $SiO_2$. This cover layer 13 is a protecting layer for separating the catalyst material layer formed in a subsequent process from the nanowire 12 and allowing them to be partially contacted. Here, after the amorphous material layer/insulation isolation layer is repeatedly deposited, the multi-layered amorphous material layer/insulation layer is patterned, and the process of FIG. 4 is performed to form a multi-layered nanowire.

Figure 5:
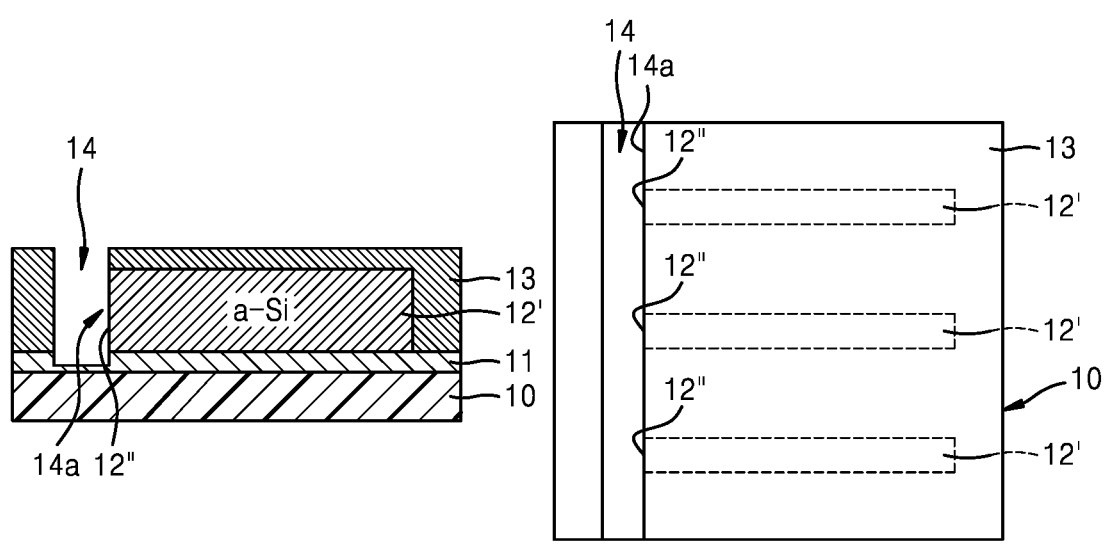
FIG. 5 illustrates an operation for forming a trench by pattering the cover layer on the substrate, according to an exemplary embodiment, wherein left drawing of each drawing is a cross-sectional view, and right drawing of each drawing is a plan view.

As shown in FIG. 5, the cover layer 13 and the nanowire 12' are patterned to be orthogonal to each other, and a trench 14 exposing only a side section of one end of the nanowire 12' is formed to a predetermined depth. The trench 14 may extend a predetermined depth below the surface of the buffer layer 11. At this time, the depth of the trench 140 with respect to the buffer layer 11 may be determined such that the surface of the catalyst material layer 15 (FIG. 6) to be described later is located below the surface of the buffer layer 11 and the bent portion under the catalyst material layer 15 deviates downward from the side section 12" of the nanowire 12'. The trench 14 may be formed to extend orthogonal to the length direction of the nanowire 12' along the arrangement direction of the nanowire 12'. Accordingly, the side section 12" of one end of the plurality of nanowires 12' is exposed to the inner wall 14a of the trench 14 that is elongated. Here, it is important that the side section 12" has a smooth surface with less roughness, and it is important that the normal line perpendicular to the side section 12" is oriented parallel to the direction of extension of the nanowire 12'.

Here, when only one nanowire 12' is formed on the substrate 10, a trench corresponding to only one end of the nanowire 12' may be applied.

Figure 6:
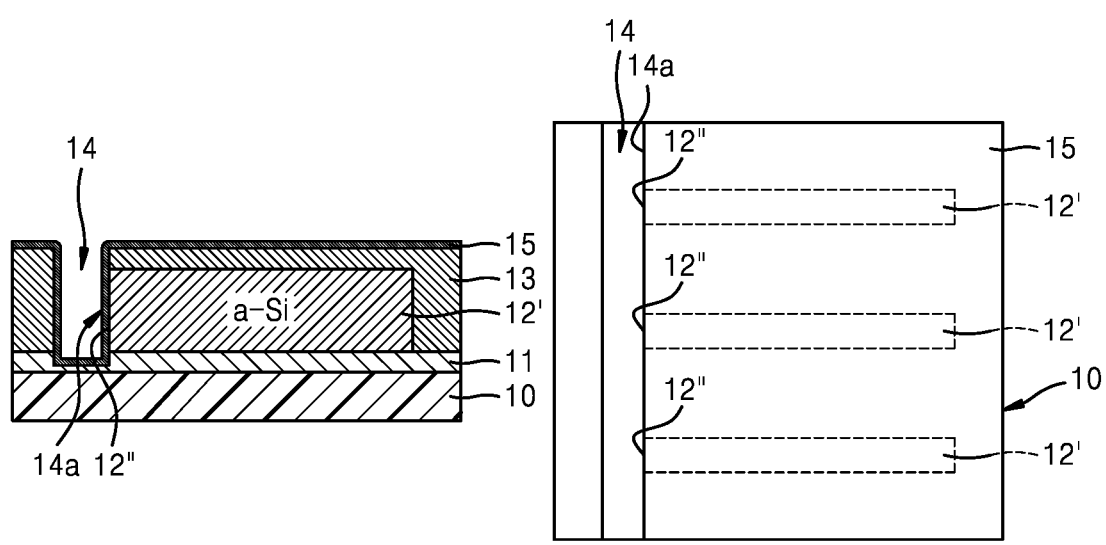
FIG. 6 illustrates an operation for forming a catalyst material layer on the cover layer, according to an exemplary embodiment, wherein left drawing of each drawing is a cross-sectional view, and right drawing of each drawing is a plan view.

As shown in FIG. 6, a catalyst material layer 15 is formed on the cover layer 13. The catalyst material layer 15 has a thickness of several nanometers, and is also formed inside the trench 14. Here, the catalyst material layer 15 is in contact with the side section 12" of one end of the nanowire 12' at the inner wall 14a of the trench 14.

Figure 7:
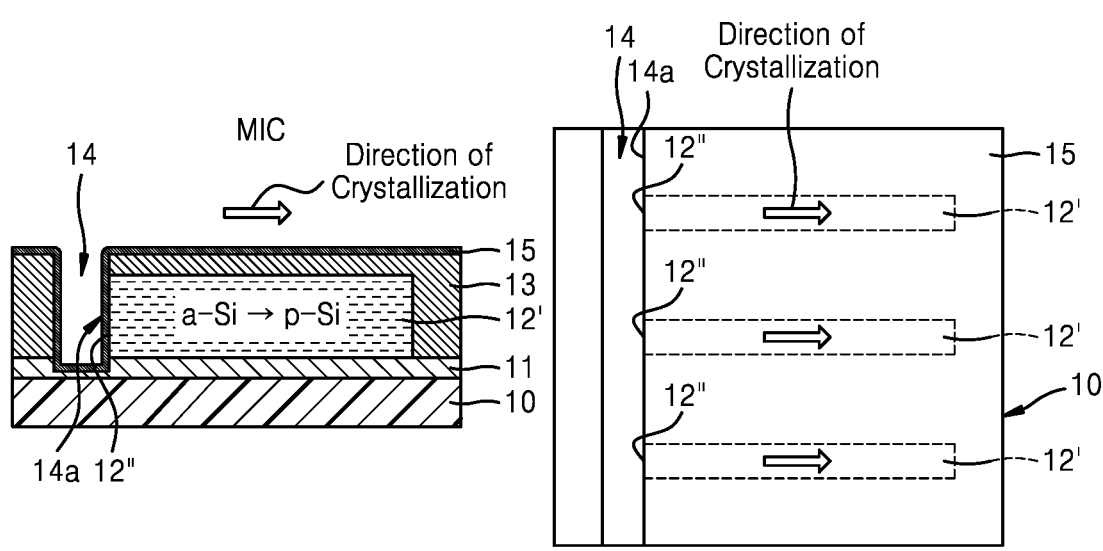
FIG. 7 illustrates an operation for performing metal-induce crystallization of the amorphous material layer, according to an exemplary embodiment, wherein left drawing of each drawing is a cross-sectional view, and right drawing of each drawing is a plan view.

As shown in FIG. 7, metal induced crystallization (MIC) is performed through heat treatment to crystallize amorphous silicon (a-Si) of the nanowire 12 to form single crystal-grained polycrystalline silicon (p-Si). Such heat treatment may be performed in a furnace, and at this time, an electromagnetic field may be applied to the furnace. According to the heat treatment, $NiSi_2$ is produced by reaction with the catalyst material layer on one side section 12" of the nanowire 12', and this $NiSi_2$ induces crystal growth of amorphous silicon while proceeding along the length direction of the nanowire.

The single crystal-grained nanowire manufactured with the concept as described above can be applied to various semiconductor devices, and depending on the design of the corresponding semiconductor device, it is possible to manufacture a desired semiconductor device by a conventional subsequent process.

Figure 8:
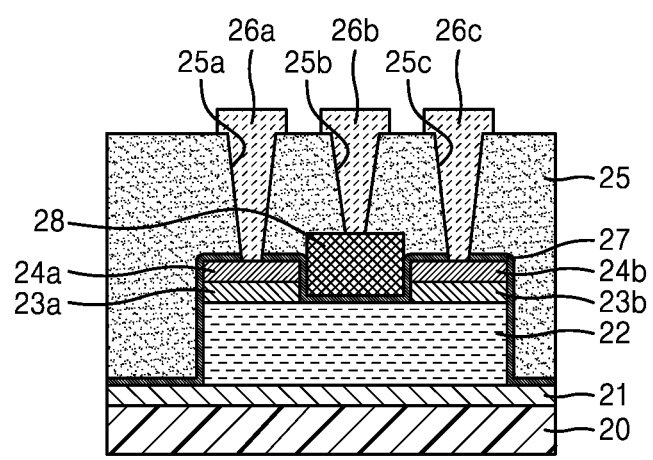
FIG. 8 illustrates a schematic cross-sectional structure of a transistor having a lateral nanowire channel according to an exemplary embodiment.

FIG. 8 illustrates a schematic cross-sectional structure of a transistor having a lateral nanowire channel according to an exemplary embodiment.

In the nanowire transistor shown in FIG. 8, a buffer layer 21 is formed on a substrate 20, and a nanowire channel 22 is formed parallel to the plane of the substrate 20 on the buffer layer 21.

A first conductive layer 23a of a drain or source region is formed on one side of the nanowire channel 22, and a second conductive layer 23b of a source or drain region is formed on the other side of the nanowire channel 22.

A gate 28 is formed on the channel region between the first conductive layer 23a and the second conductive layer 23b, and a gate insulation layer 27 is formed under the gate 28.

The nanowire 22 is a single crystal-grained semiconductor in which crystals are grown in the <111> direction, and this single crystal-grained semiconductor can be applied as a component of various semiconductor devices.

Hereinafter, an exemplary embodiment of a method of manufacturing a CMOS semiconductor device using the above nanowire manufacturing method will be described.

Hereinafter, a method of manufacturing a CMOS will be described based on the exemplary embodiment mentioned above. The structure of a lateral nano-wire transistor and a method of manufacturing the same can be easily derived through understanding the following technical content. In the following embodiments, a method of manufacturing a silicon nanowire CMOS device using amorphous silicon as a semiconductor material will be exemplarily described.

Figure 9:
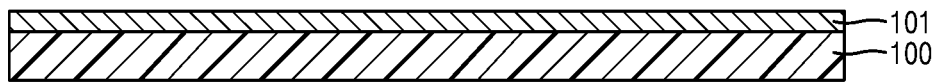
FIG. 9 illustrates an operation of forming a buffer layer on a substrate, according to another exemplary embodiment, wherein left drawing of each drawing is a cross-sectional view, and right drawing of each drawing is a plan view in FIGS. 9-28.

As shown in FIG. 9, a buffer layer 101 is formed on a substrate 100. The buffer layer 101 may be provided by a top-most dielectric layer of a multi-layered structure already formed through a preceding process. The buffer layer 101 may be formed of, for example, an insulating material such as SiO2, SiNx, SiONx, or AlOx.

Figure 10:
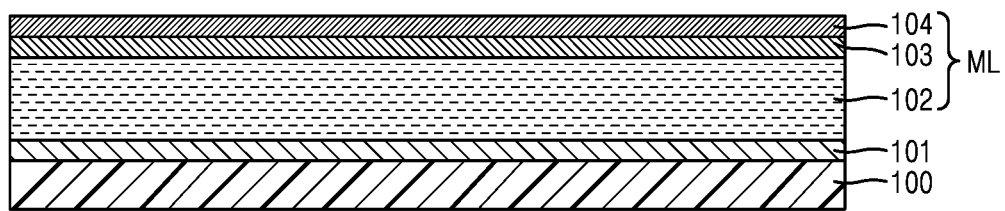
FIG. 10 illustrates an operation of forming a first multi-layered film on the buffer layer, according to another exemplary embodiment.

As shown in FIG. 10, a multi-layered film ML including a silicon channel material layer 102 and a conductive semiconductor layer 103 in an amorphous state on the buffer layer 101, and a metal layer 104 on the conductive semiconductor layer 103 is formed.

For example, the multi-layered film ML may have a multi-layered structure of p a-Si/n+a-Si/TiN for obtaining a PMOS transistor having a p-type silicon channel and n-type conductive semiconductor layers on both sides on the p-type silicon channel.

Figure 11:
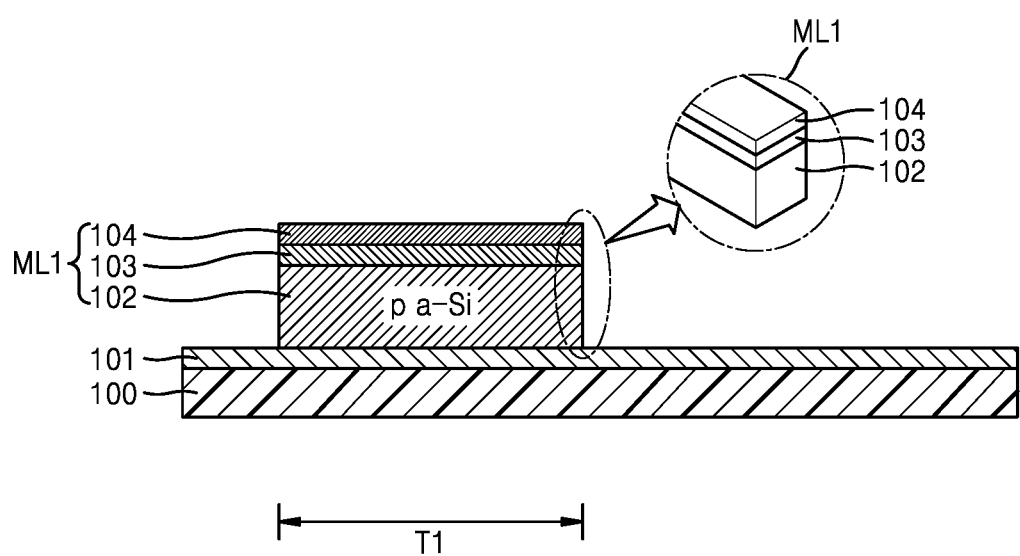
FIG. 11 illustrates an operation of forming a first multi-layered block for a first transistor region, according to another exemplary embodiment.

As shown in FIG. 11, in a region of the first transistor T1 defined as a first transistor, for example, a PMOS transistor region on the substrate, a first multi-layered block ML1 is formed by patterning the multi-layered film ML through a conventional patterning method applying a photoresist (PR) mask. By this patterning of the multi-layered film ML, the first multi-layered block ML1 remains only in the region of the first transistor T1, and the buffer layer 101 on the substrate 100 is exposed in the remaining portion. At this time, each layer of the first multi-layered block ML1, in particular, the silicon channel material layer 102, has a nanowire shape as a p-type channel, and the conductive semiconductor layer 103 and the metal layer 104 thereon also have the shape of a thin and narrow strip.

Figure 12:
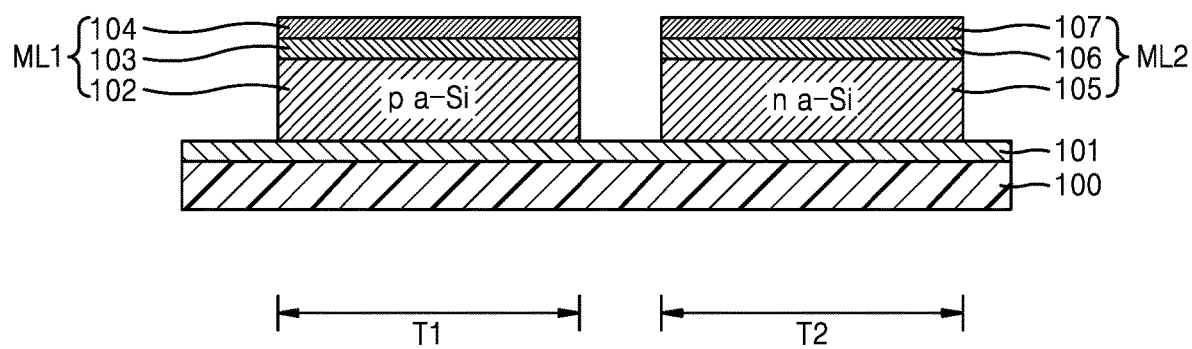
FIG. 12 illustrates an operation of forming a second multi-layer block for a second transistor region, according to another exemplary embodiment.

As shown in FIG. 12, in a portion defined as the area of the second transistor T2 on the substrate 100, a second multi-layered block ML2 for forming a second transistor, for example, an NMOS transistor, is formed in the same shape as the first multi-layered block ML1. The second multi-layered block ML2 may have a multi-layered structure of n a-Si/p+a-Si/TiN for an NMOS transistor. This second multi-layered block ML2 can be obtained through a process similar to the process of forming the first multi-layered block ML1, and has a structure in which a nanowire silicon channel material layer 105 as an n-type channel, and a conductive semiconductor layer 106 and a metal layer 107 in a strip shape are stacked from the bottom.

Figure 13:
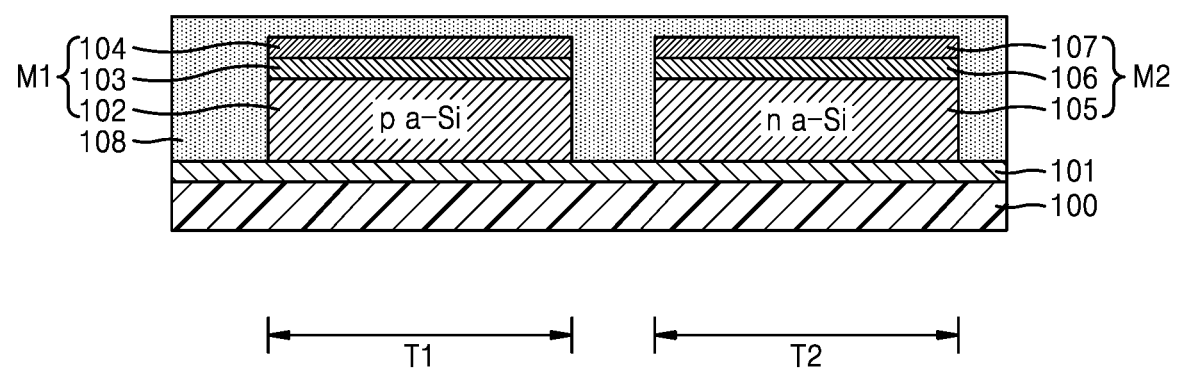
FIG. 13 illustrates an operation of forming a cover layer covering the first and second multi-layered blocks, according to another exemplary embodiment.

As shown in FIG. 13, a cover layer 108 completely covering the first and second multi-layered blocks ML1 and ML2 is formed of an insulating material such as SiO2.

Figure 14:
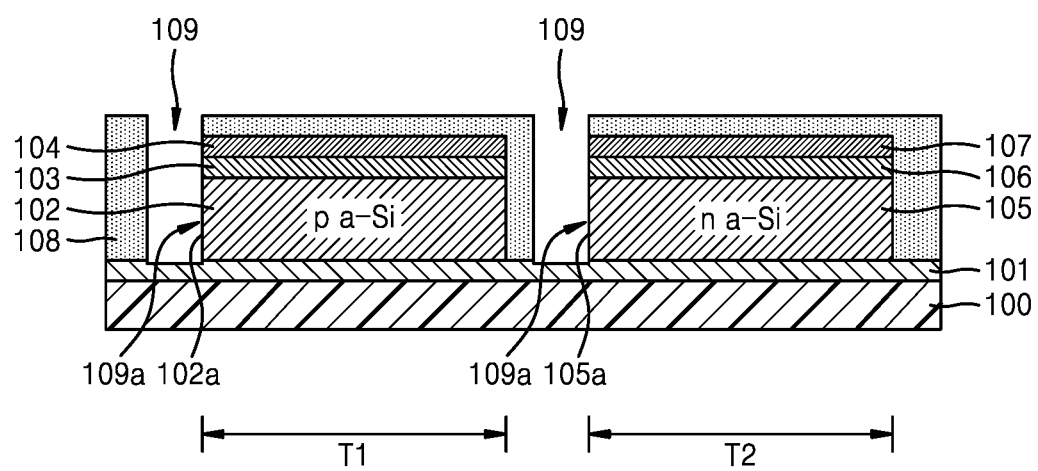
FIG. 14 illustrates an operation of forming a trench in the cover layer, according to another exemplary embodiment.

As shown in FIG. 14, a trench 109 as described above is formed in the cover layer 108. At this time, the trench 109 may be formed to extend a predetermined depth below the surface of the buffer layer 101 in the same shape as the trench 14 shown in FIG. 5, but in the drawings of this embodiment, for convenience, it is shown that the bottom of the trench 109 is formed only up to the surface of the buffer layer 101. In this way, the trench 109 that can be extended to the buffer layer 101 is simultaneously formed on one side (left in the drawing) of the first multi-layered block ML1 and the second multi-layered block ML2, and at this time, side sections 102a and 105a of one end of the silicon channel material layers 102 and 105 of each of the first multi-layered block ML1 and the second multi-layered block ML2 are exposed to the inner side surface 109a of the trench 109.

Figure 15:
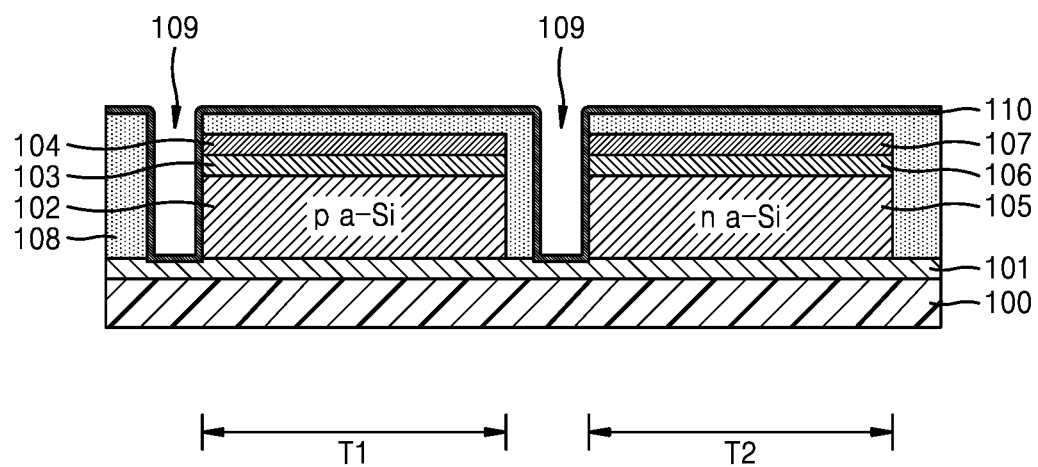
FIG. 15 illustrates an operation of forming a catalyst material layer on the cover layer and in the inside of the trench, according to another exemplary embodiment.

As shown in FIG. 15, a catalyst material layer 110 is formed at a thickness of several nanometers on the surface of the cover layer 108 and in the inside of the trench 109 through an ALD method or the like.

The catalyst material may be any one selected from the group consisting of Ni, NiOx, NiCxOy, NiNxOy, NiCxNyOz, NiCxOy:H, NiNxOy:H, NiCxNyOz:H, NixSiy, and NixGey.

After the catalyst material layer 110 is formed, metal induced crystallization (MIC) is performed by heat treatment. Heat treatment may be performed in a furnace, and an electromagnetic field may be applied to the furnace. By this heat treatment, the amorphous conductive layer 103 and the amorphous semiconductor layer 102 are crystallized to obtain a single crystal grained polycrystalline conductive layer 103 and polycrystalline semiconductor layer 102.

Figure 16:
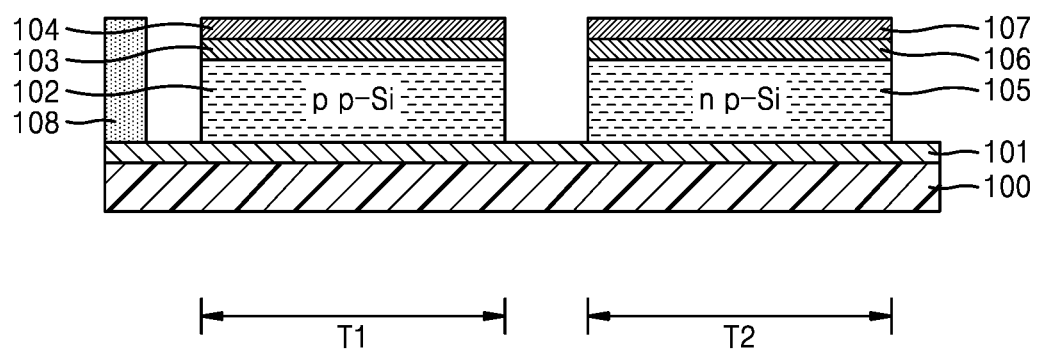
FIG. 16 illustrates an operation of removing the catalyst material layer after obtaining a polycrystalline semiconductor layer by heat treatment, according to another exemplary embodiment.

As shown in FIG. 16, after obtaining the polycrystalline semiconductor layer 102 by heat treatment, the laminate on the metal layer 104 is removed by etching. In FIG. 16, it is expressed that the catalyst material layer 110 and the cover layer 108 under the catalyst material layer 110 are removed together, and according to another embodiment, only the catalyst material layer 109 is removed, and the cover layer 108 under the catalyst material layer 109 may remain as it is.

Figure 17:
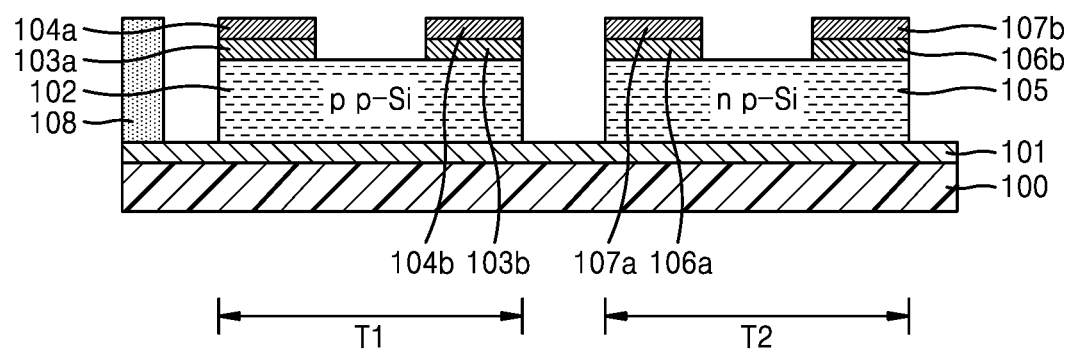
FIG. 17 illustrates an operation of forming conductive semiconductor layers and metal layers on the first and second transistor regions, according to another exemplary embodiment.

As shown in FIG. 17, conductive semiconductor layers 103 and 106 and metal layers 104 and 107 are patterned in the respective first and second transistors T1 and T2 regions so that a source or a drain 103a or 106a, a drain or a source 103c or 106c, and a source electrode or a drain electrode 104a or 107a, and a drain electrode or a source electrode 104c or 107c are formed in each region.

Figure 18:
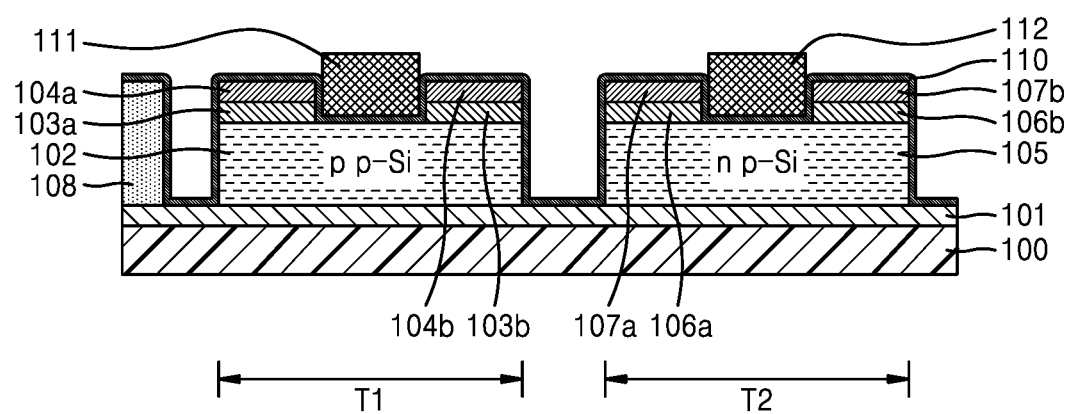
FIG. 18 illustrates an operation of forming gate insulation layers over the first and second transistor regions, according to another exemplary embodiment.

As shown in FIG. 18, a gate insulation layer 110 is formed on the source electrode or drain electrode 104a or 107a and the drain electrode or the source electrode 104c or 107c, and gates 111 and 112 are formed on the gate insulation layer 110 at corresponding positions of each of the first and second transistors T1 and T2, respectively.

Figure 19:
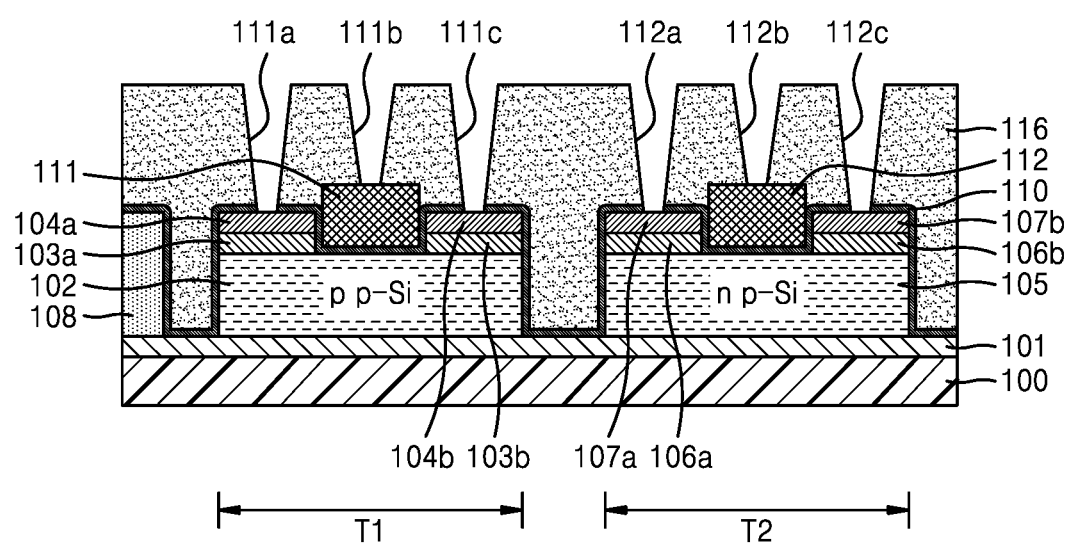
FIG. 19 illustrates an operation of forming an ILD layer having contact holes over the first and second transistor regions, according to another exemplary embodiment.

As shown in FIG. 19, an ILD layer 116 covering the entire transistor structure is formed on the gates 111 and 112. In the ILD layer 116, a plurality of contact holes 111a, 111b, 111c, 112a, 112b, and 112c corresponding to the sources, gates, and drains of the first and second transistors T1 and T2 are formed by a subsequent patterning process.

Figure 20:
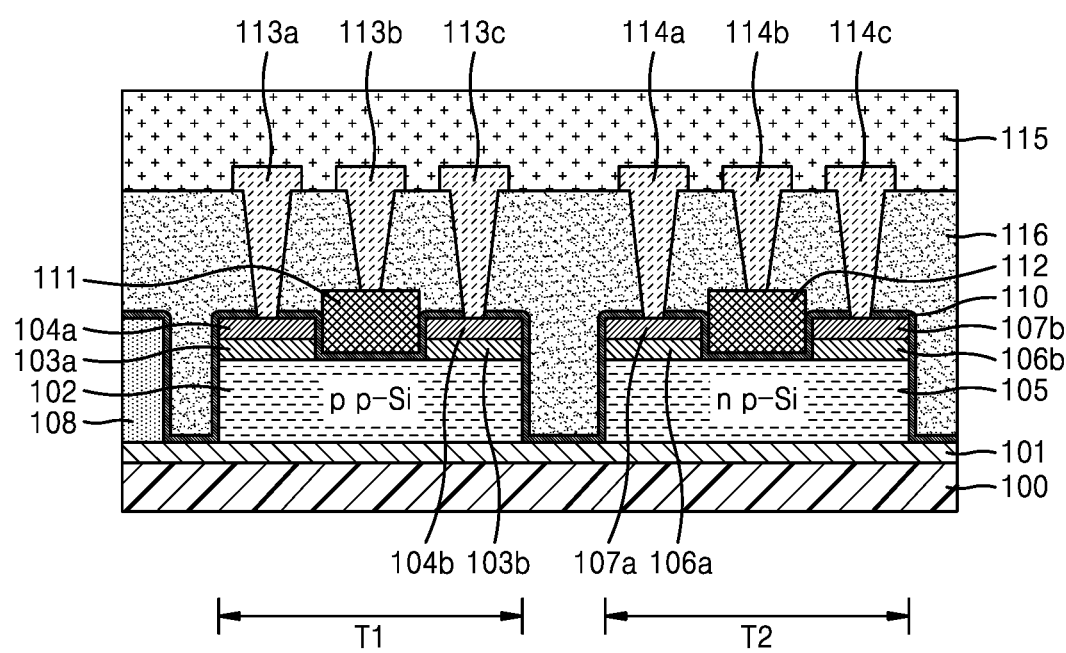
FIG. 20 illustrates an operation of forming metal pads and a passivation layer covering the metal pads on the first and second transistor regions, according to another exemplary embodiment.

As shown in FIG. 20, metal pads 113a, 113b, 113c, 114a, 114b, and 114c electrically connected to the source or drain electrodes 104a or 107a, the drain or source electrodes 104c or 107c, and the gates 104b and 107b of the first and second transistors T1 and T2 below the contact holes 111a, 111b, 111c, 112a, 112b, and 112c through the contact holes 111a, 111b, 111c, 112a, 112b, and 112c are formed on the ILD layer 116, and a passivation layer 115 covers the upper part of the metal pads 113a, 113b, 113c, 114a, 114b, and 114c.

Following this process, an additional process may be performed according to the design of the electronic device to be applied.

The nanowire semiconductor device exemplarily described through the above embodiments has a single crystal-grained nanowire channel in which a crystal grain is grown in a lateral direction between a source and a drain disposed parallel to a substrate. When such nanowires are formed in the shape of a thin fin, a so-called FIN transistor can be obtained. These nanowires have a single crystal structure grown in the <111> direction by MIC using a metal catalyst.

If the crystal growth of the silicon nanowire depends on the MIC, as a crystallization catalyst layer, amorphous film formed of at least one selected from the group consisting of NiOx, NiCxOy, NiNxOy, NiCxNyOz, NiCxOy:H, NiNxOy:H, NiCxNyOz:H, NixSiy, and NixGey having a thickness of several nanometers can be applied. The formation of such a catalyst layer can be deposited by the ALD method. In the description of the above embodiment, the silicon channel material layer corresponding to the channel may be doped with a known n-type or p-type non-sulfur material, and according to another embodiment, may be formed of intrinsic silicon.

MIC heat treatment for crystallization of amorphous silicon may be performed in a furnace, and may be performed in a furnace with an electromagnetic field. The method of manufacturing a semiconductor nanowire described in the exemplary embodiment can be applied to a method of manufacturing a memory device and a diode in addition to a transistor.

In the above-described embodiment, an example in which silicon is applied as a semiconductor material for a conductive layer and a channel region in the source and drain regions has been described, but the semiconductor material may be formed of SiGe, Ge, and the like in addition to silicon.

In the above embodiment, the gate corresponding to the nanowire channel is formed only on one side. However, by modifying some of the processes described above, it is possible to obtain a semiconductor device such as a nanowire transistor having a gate all around gate completely surrounding the nanowire.

According to another exemplary embodiment, a multi-channel gate all-around nanowire transistor semiconductor element may be obtained based on the above method.

FIGS. 21 to 25 illustrate a part of a manufacturing process of a nanowire transistor having an all-around gate. In each drawing, left drawing is a schematic vertical cross-sectional view, and right drawing is a schematic perspective view.

Figure 21:
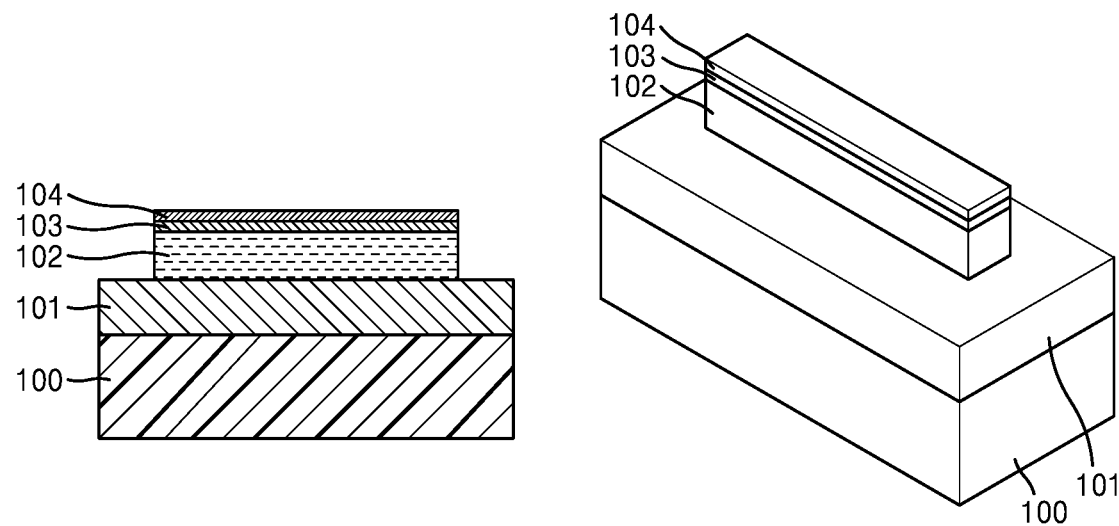
FIG. 21 illustrates a multi-layered block including a polycrystalline semiconductor layer, a conductive semiconductor layer formed on the substrate 100 through a process, according another exemplary embodiments, wherein left drawing is a schematic vertical cross-sectional view, and right drawing is a schematic perspective view.

In FIG. 21, a multi-layered block ML1 including a polycrystalline semiconductor layer 102, a conductive semiconductor layer 103, and a metal layer 104 is formed on the substrate 100 through the above-described process. FIG. 21 corresponds to FIG. 16 mentioned in the description of the above-described embodiment. This multi-layered block ML1 is for one transistor, and according to another embodiment, as in the above-described embodiment, a plurality of multi-layered blocks may be provided.

Figure 22:
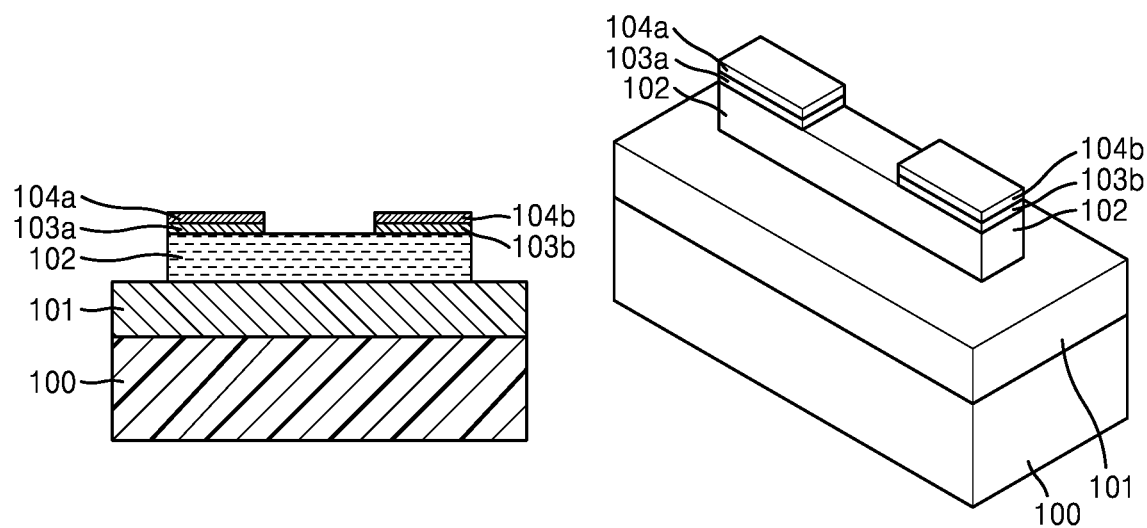
FIG. 22 illustrates a patterned source and a drain on the multi-layered block, according another exemplary embodiments, wherein left drawing is a schematic vertical cross-sectional view, and right drawing is a schematic perspective view.

As shown in FIG. 22, by simultaneously patterning the metal layer 104 of the multi-layered block ML1 and the conductive semiconductor layer 103 under the metal layer 104, a source or drain 103aa and a drain or source 103c, and a source or drain electrode 104a and a drain electrode or source electrode 104c are formed.

Figure 23:
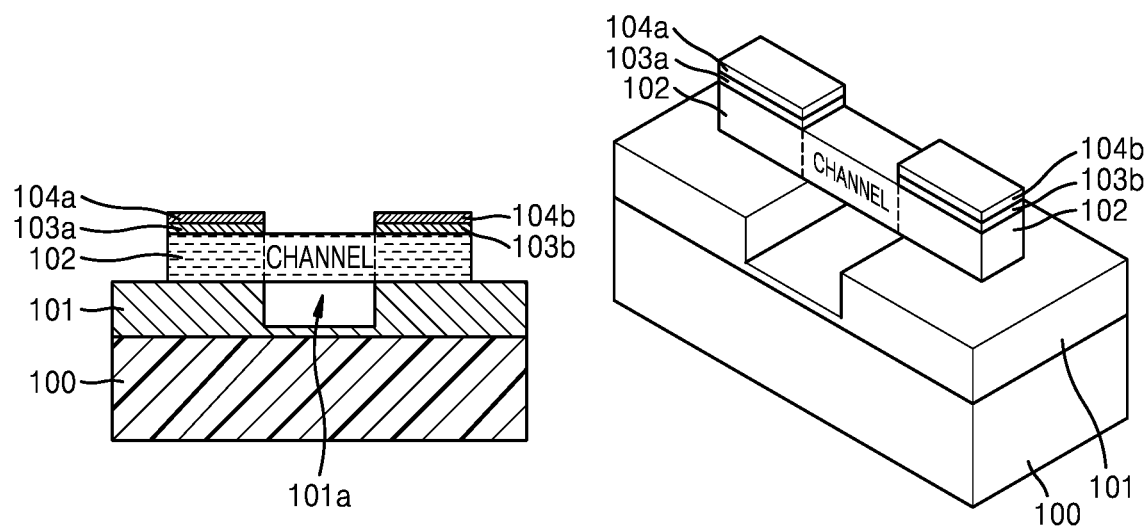
FIG. 23 illustrates a cavity formed in the buffer layer under the multi-layered block, according another exemplary embodiments, wherein left drawing is a schematic vertical cross-sectional view, and right drawing is a schematic perspective view.

As shown in FIG. 23, through selective etching of the buffer layer 102, a portion of the buffer layer 101 corresponding to the channel region between the source and drain regions on both sides is etched to a predetermined depth to form a cavity 101a so that the channel region of the polycrystalline semiconductor layer 102 is floated from the device plate 100 to form a bridge shape of the polycrystalline semiconductor layer 102.

Figure 24:
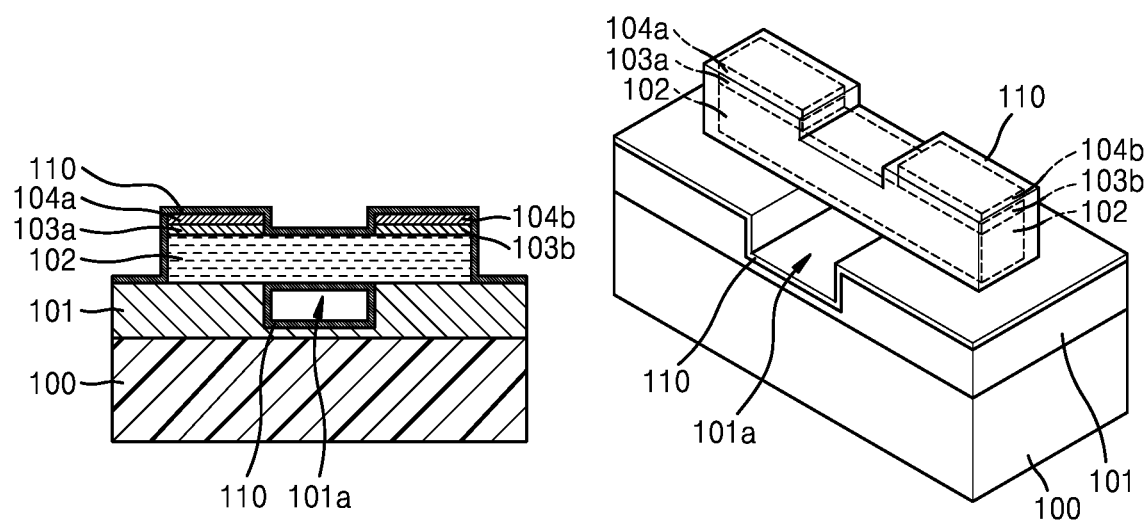
FIG. 24 illustrates a gate insulation layer surrounding the multi-layered block, according another exemplary embodiments, wherein left drawing is a schematic vertical cross-sectional view, and right drawing is a schematic perspective view.

As shown in FIG. 24, a gate insulation layer 110 surrounding the polycrystalline semiconductor layer 102 is formed through an ALD method or the like. The gate insulation layer 110 is also formed inside the cavity 101a.

Figure 25:
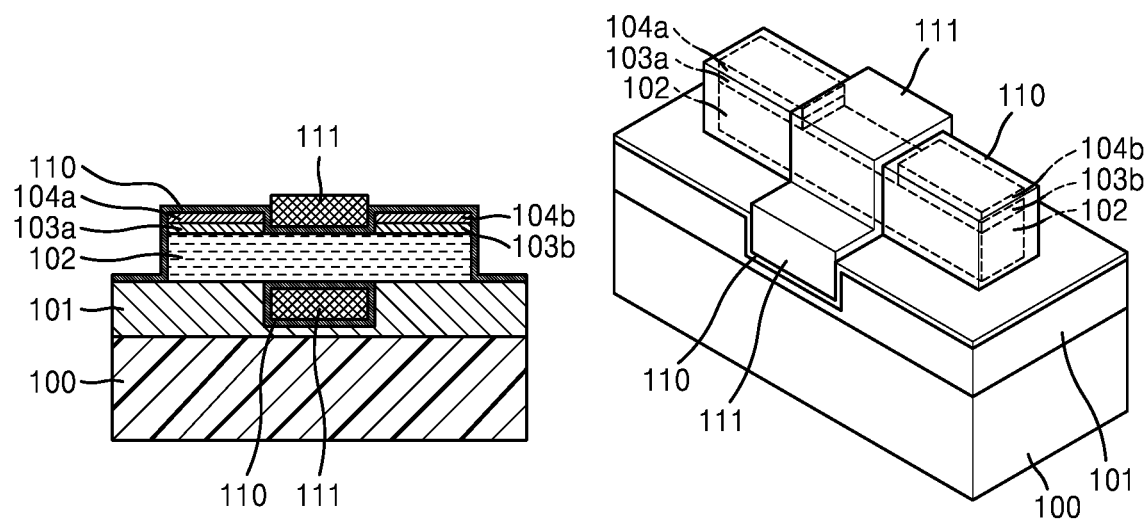
FIG. 25 illustrates an around gate surrounding middle of the multi-layered block, according another exemplary embodiments, wherein left drawing is a schematic vertical cross-sectional view, and right drawing is a schematic perspective view.

As shown in FIG. 25, after depositing a gate material on the gate insulation layer 110 by ALD method or the like and patterning the gate material, an around gate 111a surrounding a channel of the polycrystalline semiconductor layer 102 is formed. According to the ALD method, a film is formed on all surfaces of the exposed multilayer structure, and a desired material film can be formed in the cavity 101a.

After performing the above process, a target semiconductor device is completed through a generally known additional process.

Meanwhile, in the above-described embodiment, a semiconductor device having a single channel has been introduced, and a multi-channel semiconductor device can be manufactured by applying the process described above.

According to another exemplary embodiment, through an iterative process applying the processes of FIGS. 4 and 5 described above, a multi-layered nanowire stack can be formed.

Figure 26:
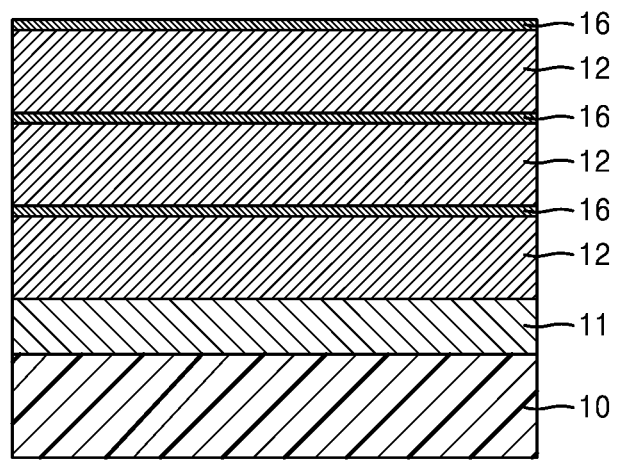
FIG. 26 illustrates a stack of a sandwich structure including an amorphous material layer made of a material to be crystallized and an insulation layer, according to another exemplary embodiments.

As shown in FIG. 26, a stack of a sandwich structure including an amorphous material layer 12 made of a material to be crystallized and an insulation layer 16 covering the amorphous material layer 12 is formed on the buffer layer 11 on the substrate 10.

Figure 27:
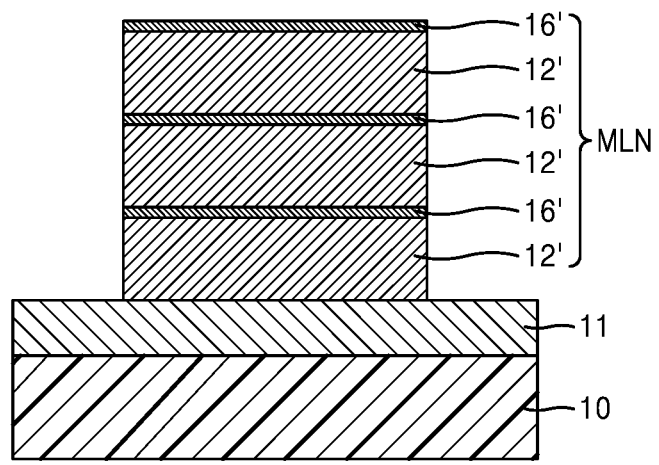
FIG. 27 illustrates a patterned stack of a sandwich structure including an amorphous material layer and an insulation layer, according to another exemplary embodiments.

As shown in FIG. 27, the stack of the sandwich structure is patterned to form a multi-layered nano-wire (MLN) in which a plurality of nanowires 12' are multi-stacked.

Figure 28:
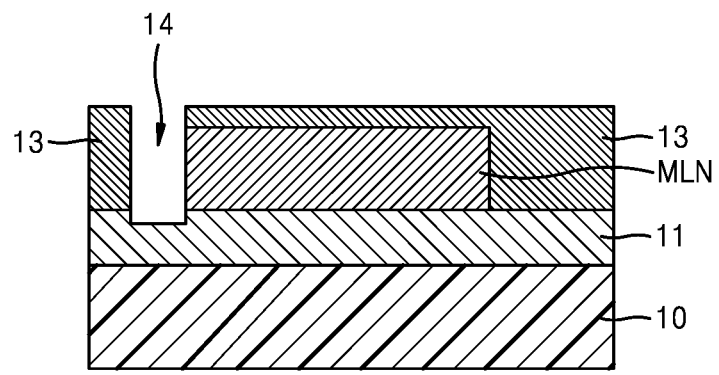
FIG. 28 illustrates a cover layer covering a nanowire multilayer and a trench formed in the cover layer, according another exemplary embodiments.

As shown in FIG. 28, a cover layer 13 covering the nanowire multilayer is formed, and a trench 14 is formed by the process as described above. This process corresponds to the process in FIG. 5 described above. Thereafter, a multi-layered polycrystalline nanowire is obtained through the processes of FIGS. 6 and 7, and a target semiconductor device is obtained through a subsequent process.

According to another exemplary embodiment, a silicon solar cell may be manufactured on a polycrystalline silicon substrate or a heterogeneous substrate based on the above method, and a 3D stacked memory can be fabricated by fabricating a 3D stacked structure, and various devices can be integrated on a single substrate.

A method of manufacturing a semiconductor device according to an embodiment of the present invention has been described with reference to the embodiment shown in the drawings for better understanding, but this is only exemplary, and those of ordinary skill in the art will understand that various modifications and equivalent other embodiments are possible therefrom. Therefore, the true technical protection scope of the present invention should be determined by the appended claims.

What is claimed is:

1. A method of manufacturing a nanowire semiconductor element, the method comprising:

forming a multi-layered film including an amorphous channel material layer, an amorphous conductive semiconductor layer, and a metal layer on a substrate;

patterning the multi-layered film to form at least one multi-layered block including a nanowire channel material layer, a strip-type conductive semiconductor layer, and a metal layer in a portion defined as a transistor region;

forming a cover layer covering the multi-layered block;

forming a trench having an inner wall on the cover layer, wherein the trench exposes a side surface of one end of the channel material layer;

forming a catalyst material layer on the cover layer and inside the trench to contact the catalyst material layer with the side surface of the one end of the channel material layer exposed to the inner wall of the trench;

heat-treating the multi-layered film to crystallize the channel material layer; and patterning the metal layer and the conductive semiconductor layer after removing the cover layer covering the metal layer to form a source and a drain, and a source electrode and a drain electrode corresponding to the semiconductor material layer.

2. The method of claim 1, wherein the forming of the multi-layered block comprises:

forming a first multi-layered block including a p-type nanowire channel material layer, an n-type conductive semiconductor layer, and a metal layer; and, forming a second multi-layered block including an n-type nanowire channel material layer, a p-type conductive semiconductor layer, and a metal layer.

3. The method of claim 1, wherein the channel material layer is formed of any one selected from the group consisting of Si, SiGe, and Ge.

4. The method of claim 3, wherein the catalyst material layer is formed of at least one material selected from the group consisting of Ni, NiOx, NiCxOy, NiNxOy, NiCxNyOz, NiCxOy:H, NiNxOy:H, NiCxNyOz:H, NixSiy, and NixGey.

5. The method of claim 1, wherein the catalyst material layer is formed of at least one material selected from the group consisting of Ni, NiOx, NiCxOy, NiNxOy, NiCxNyOz, NiCxOy:H, NiNxOy:H, NiCxNyOz:H, NixSiy, and NixGey.

6. The method of claim 1, wherein the channel material layer is formed of an intrinsic semiconductor material or a non-intrinsic semiconductor material.

7. The method of claim 2, wherein the channel material layer is formed of an intrinsic semiconductor material or a non-intrinsic semiconductor material.

* * * * *